United States Patent [19]
Chow et al.

[11] Patent Number: 6,020,593
[45] Date of Patent: Feb. 1, 2000

[54] OPSISTOR TRANSMITTER DATA COMPRESSION SYSTEM

[75] Inventors: Alan Y. Chow, 191 Palamino Pl., Wheaton, Ill. 60187; Vincent Y. Chow, Hanover Park, Ill.

[73] Assignee: Alan Y. Chow, Wheaton, Ill.

[21] Appl. No.: 08/977,852

[22] Filed: Nov. 25, 1997

Related U.S. Application Data

[63] Continuation-in-part of application No. 08/755,729, Nov. 25, 1996, Pat. No. 5,837,995.

[51] Int. Cl.[7] .................................................. G02B 27/00
[52] U.S. Cl. ...................................... 250/551; 250/214 LS; 359/152; 348/222
[58] Field of Search .......................... 250/551, 214 LS, 250/208.1, 214.1, 214 R; 359/152, 154, 149; 348/222, 294, 311

[56] References Cited

U.S. PATENT DOCUMENTS

| 4,001,867 | 1/1977 | Kravitz et al. |
|---|---|---|
| 4,873,448 | 10/1989 | Shirai ....................................... 250/551 |
| 5,130,528 | 7/1992 | Phillips, Jr. ........................ 250/214 LS |
| 5,130,776 | 7/1992 | Popovic et al. . |
| 5,223,728 | 6/1993 | Gempe ..................................... 257/443 |
| 5,256,882 | 10/1993 | Miyasaka ................................. 250/551 |
| 5,338,991 | 8/1994 | Lu . |
| 5,351,309 | 9/1994 | Lee et al. ................................... 382/22 |
| 5,491,349 | 2/1996 | Komoto et al. ........................... 257/88 |
| 5,648,655 | 7/1997 | Rostoker ............................... 250/208.1 |
| 5,711,201 | 1/1998 | Lin et al. ............................. 250/214 R |

FOREIGN PATENT DOCUMENTS

| 0084621 | 11/1982 | European Pat. Off. . |
| 0501904 | 2/1992 | European Pat. Off. . |
| 9639221 | 12/1996 | European Pat. Off. . |

OTHER PUBLICATIONS

The Vertical Integration of Crystalline NMOS and Amorphous Orientational Edge Detector, Heng–Chih Lin, Wen––Hyh Sah, and Si–Chen Lee (Dec. 12, 1992) vol. 39, No. 12, pp. 2810–2812.

Primary Examiner—Que T. Le
Attorney, Agent, or Firm—Mayer, Brown & Platt

[57] ABSTRACT

The present invention relates to a transmission method and device for efficient compression of digital data. The invention uses an optoelectronic coupler to receive light signals from a light transmitter at two bandwidths. A modulated signal generator is coupled to the transmitter which coverts voltage phase data signals to light signals. The data signals are modulated with a plurality of master profiles and sub-profiles with different cycle time variations. The optoelectronic coupler has a pair of photodiodes. Light filters disposed on both diodes allow either the first or second bandwidth of light to pass. Conductors electrically couple the anode of the each photodiode to the cathode of the other photodiode which produce the voltage phase signal. A signal receiver is connected to the coupler and decodes the voltage-phase signal.

24 Claims, 9 Drawing Sheets

OPSISTOR TRANSMITTER DATA COMPRESSION SYSTEM

RELATED APPLICATIONS

This application is a continuation in part to application Ser. No. 08/755,729, now U.S. Pat. No. 5,837,995, titled "Wavelength- Controllable Voltage-Phase Photodiode Optoelectric Switch (Opsistor)" filed on Nov. 25, 1996 to the same inventors.

FIELD OF INVENTION

This invention relates to a method for efficient transmission of data. More particularly, the invention relates to a data compression method for increasing the speed of data transmission using an opsistor-based transmitter.

BACKGROUND OF INVENTION

Reliable and quick data transmission is essential in the information age. Data transmission over long distances is primarily accomplished by using electro-magnetic carrier waves at different frequencies. Such data transmission may occur through the air by open air transmitters (wireless) or through a transmission medium such as wire. However, such methods are inherently limited by the medium carrying the electro-magnetic waves. In the case of wire, the material properties of metals used to construct the wire limit the speed and bandwidth of data transmission. In the case of open air transmission, transmission signals are subject to interference thus distorting or blocking the signal.

One proposed solution is the use of light based transmitters. Such transmitters use light emissions at different frequencies or bandwidths to encode and carry data. A light transmitter may be used over short distances for wireless communication. Longer distances may be covered using a fiber optic cable. Such light based transmitters theoretically have much greater bandwidths and speed as compared to electromagentic wire transmitters.

One promising application for light based transmission involves the use of optical switches. Previously, optical switches have typically been based on optosensors consisting of a single photodiode, phototransistor, photodarlington, or similar devices, which in each case is a two-state, current-driven device that has an "on" or "off" current state. For applications such as optocouplers and optoisolators, these devices responded to an "on" or "off" pre-coupled signal with a corresponding "on" or "off" post-coupled current-signal. The inherent speed of such devices has been limited by the rate at which they can switch their currents "on" and "off," with a limiting factor often being the passive return-to-ground period. In addition for an "on" current state to be recognized, the current had to be of a significantly greater amplitude than the background noise. However, the higher the signal current that was needed to generate this recognition, the longer it would take for the switch device to generate that current level, and the even longer period before the switch device would return to the ground level. These characteristics of previous optoelectronic switches resulted in relatively slow switching speeds of usually less than 1 MHZ for a standard photodiode, and even slower speeds for more complicated devices such as phototransistors.

Although optoelectronic switches can be designed to respond with faster switch frequencies by using special circuitry, the additional components of such circuitry increase the complexity and cost of such devices. Further, the transmitter and receiving elements of fast optoelectronic switches have had to be in close proximity, usually in a single package, to function efficiently and to minimize extraneous light interference.

Thus, there exists a need for a more efficient use of bandwidth in conjunction with an opsistor-based open air transmission device. There also exists a need for a more efficient use of bandwidth in conjunction with an opsistor-based fiber optics transmission device.

SUMMARY OF THE INVENTION

These needs are addressed in the present invention which is embodied in an optoelectronic coupler for coupling a source of light signals to a receiver that can process voltage-phase signals. The coupler arrangement has a light transmitter which generates light signals of first and second bandwidths. The coupler arrangement also has a switch receiver having at least one pair of first and second photodiodes. A first conductor electrically connects the anode of the first photodiode to the cathode of the second photodiode. A second conductor electrically connects the cathode of the first photodiode to the anode of the second photodiode. A first light filter is disposed on the photoactive surface of the first photodiode and allows the first bandwidth of light to pass. A second light filter is disposed on the photoactive surface of the second photodiode and allows the second bandwidth of light to pass. The light transmitter signals utilizing the first and second bandwidths are converted into voltage-phase signals across the first and second conductors. A modulated signal generator sends data signals to the optoelectronic coupler's two-wavelength light transmitter for transmission to the photodiodes. The data signals are modulated in a plurality of master profiles and subprofiles with different cycle time variations. A signal receiver for receiving and decoding voltage-phase data is coupled to the optoelectronic switch receiver.

The invention is further embodied in a method of data compression. This method involves transmitting and receiving digital data using a light transmitter generating light signals at two bandwidths. The data signals are modulated with a plurality of master profiles and subprofiles with different cycle time variations. Light signals of first and second bandwidths representative of the data signals are generated. The light signals are received by a switch receiver having at least one pair of first and second photodiodes. A first conductor electrically connects the anode of the first photodiode to the cathode of the second photodiode. A second conductor electrically connects the cathode of the first photodiode to the anode of the second photodiode. A first light filter is disposed on the photoactive surface of the first photodiode that allows the first bandwidth of light to pass. A second light filter is disposed on the photoactive surface of the second photodiode and allows the second bandwidth of light to pass. The light signals are converted into voltage-phase signals across the first and second conductors The voltage-phase signals are received and decoded from the optoelectronic coupler's two-wavelength optoelectronic switch receiver It is to be understood that both the foregoing general description and the following detailed description are not limiting but are intended to provide further explanation of the invention claimed. The accompanying drawings, which are incorporated in and constitute part of this specification, are included to illustrate and provide a further understanding of the method and system of the invention. Together with the description, the drawings serve to explain the principles of the invention.

DESCRIPTION OF THE PREFERRED EMBODIMENT

Figure 1:
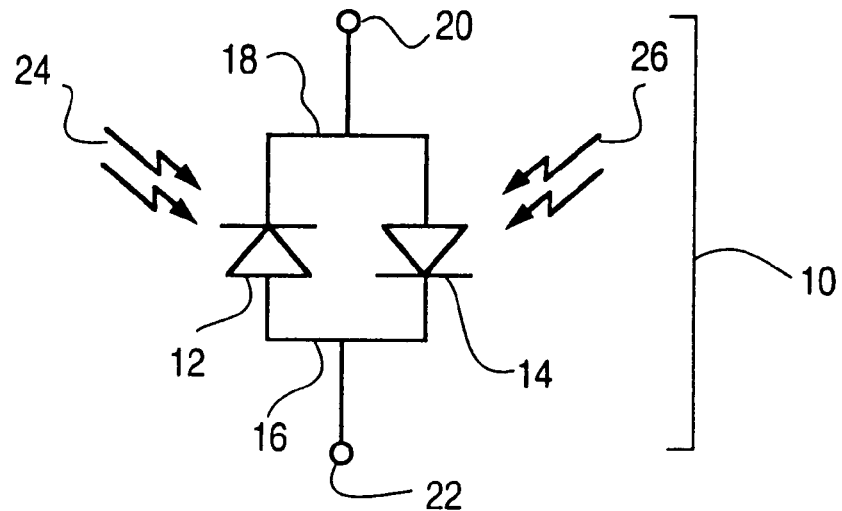
FIG. 1 is a schematic diagram of the basic opsistor according to the first preferred embodiment of the present invention.

While the present invention is capable of embodiment in various forms, there is shown in the drawings and will hereinafter be described a presently preferred embodiment with the understanding that the present disclosure is to be considered as an exemplification of the invention, and is not intended to limit the invention to the specific embodiment illustrated.

The opsistor (10) (FIG. 1) comprises two PIN photodiodes, the first photodiode (12) and the second photodiode (14), electrically connected in an inverse parallel manner such that the anode of the first photodiode (12) is electrically connected to the cathode of the second photodiode (14) via a first common conductor (16), and the cathode of the first photodiode (12) is connected to the anode of the second photodiode (14) via a second common conductor (18). The voltage phase developed by the Opsistor (10) is measured from the first output terminal (20) and the second output terminal (22). A first transmitter signal light source (24) to the first photodiode (12) is represented by the arrows (24). A second transmitter signal light source (26) to the second photodiode (14) is represented by the arrows (26). The voltage-phase developed at the output terminals (20,22) is determined by which of the two photodiodes (12,14) produces a higher voltage which is dependent on the relative intensity of illumination they receive from the transmitter signal light sources (24,26). For example if the first photodiode (12) produces a higher voltage than the second photodiode (14), then the voltage phase measured from the first output terminal (20) will be negative and the voltage-phase from the second output terminal (22) will be positive. On the other hand, if the voltage from the second photodiode (14) is greater than the voltage from the first photodiode (12), then the voltage-phase measured from the first output terminal (20) will be positive and the voltage-phase measured from the second output terminal (22) will be negative. Thus if the two photodiodes (12,14) are similar or identical as possible, the voltage-phase from the output terminals (20,22) is controlled by relative intensity of illumination of the two photodiodes, i.e. changes in the relative illumination from transmitter signal light sources (24,26) to the two photodiodes (12,14).

Figure 2:
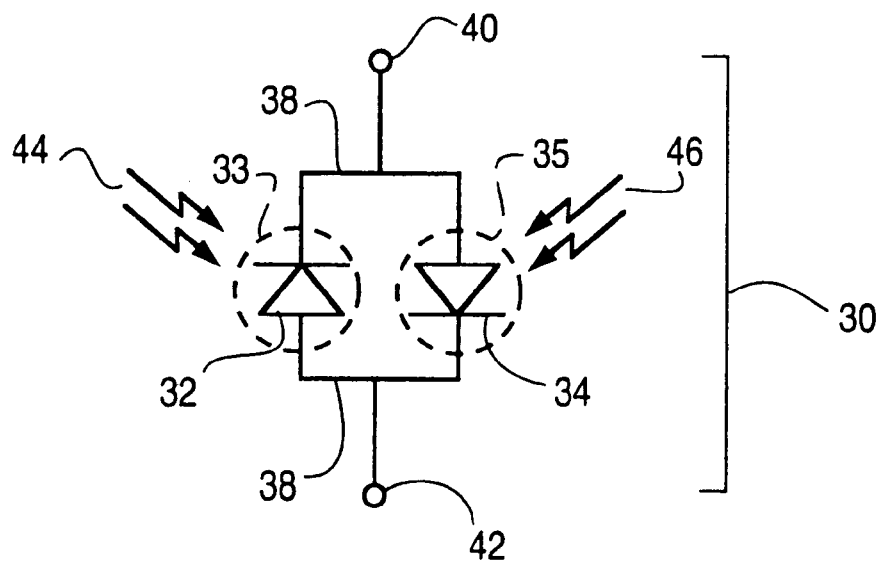
FIG. 2 is a schematic diagram of the OPS-F according to the second preferred embodiment of the present invention.

A preferred embodiment (FIG. 2) is a bandwidth-filtered Opsistor ("the OPS-F") (30). The OPS-F (30) comprises two PIN photodiodes (32,34), the first photodiode (32) filtered with the first bandwidth-portion filter (33), and the second photodiode (34) filter with the second bandwidth-portion filter (35), electrically connected in an inverse parallel manner such that the anode of the first photodiode (32) is electrically connected to the cathode of the second photodiode (34) via a first common conductor (36), and the cathode of the first photodiode (32) is connected to the anode of the second photodiode (34) via a second common conductor (38). The first bandwidth-portion filter (33) passes a different bandwidth of transmitter signal light than the second wavelength-portion filter (35). The voltage-phase developed by the OPS-F (30) is measured from the first output terminal (40) and the second output terminal (42). The first bandwidth-portion signal light source ("WPSLS-1") (44) to the first photodiode (32) is represented by the arrows (44). The second bandwidth-portion signal light source ("WPSLS-2")(46) to the second photodiode (34) is represented by the arrows (46). Because each wavelength-portion filtered photodiode (32, 34) responds only to its own specific bandwidth of light, WPSLS-1 (44) for photodiode (32) and WPSLS-2 (46) for photodiode (34) can be provided from a distant location without crosstalk interference. The term "light" is not restricted to visible light, but also include wavelengths from the far ultraviolet to the far infrared.

The voltage-phase developed at the output terminals (40,42) is determined by which of the two photodiodes (32,34) produces a higher voltage which in turn is dependent on the relative illumination they receive from the transmitter signal light sources, WPSLS-1 (44) and WPSLS-2 (46). For example in FIG. 2, if the first photodiode (32) receives a greater illumination from WPSLS-1 (44) and thus produces a higher voltage than the second photodiode (34) being illuminated by WPSLS-2 (46), then the voltage-phase measured from the first output terminal (40) will be negative and the voltage-phase from the second output terminal (42) will be positive. On the other hand, if the second photodiode (34) receives a greater illumination from WPSLS-2 (46) and thus produces a higher voltage than the first photodiode (32) receiving illumination from WPSLS-1 (44), then the voltage-phase measured from the first output terminal (40) will be positive and the voltage-phase measured from the second output terminal (42) will be negative. Thus if the two photodiodes (32,34) are similar or identical, the voltage-phase from the output terminals (40,42) is controlled by relative illumination and changes in the relative illumination of WPSLS-1 (44) and WPSLS-2(46) to the two photodiodes (32,34).

Figure 3:
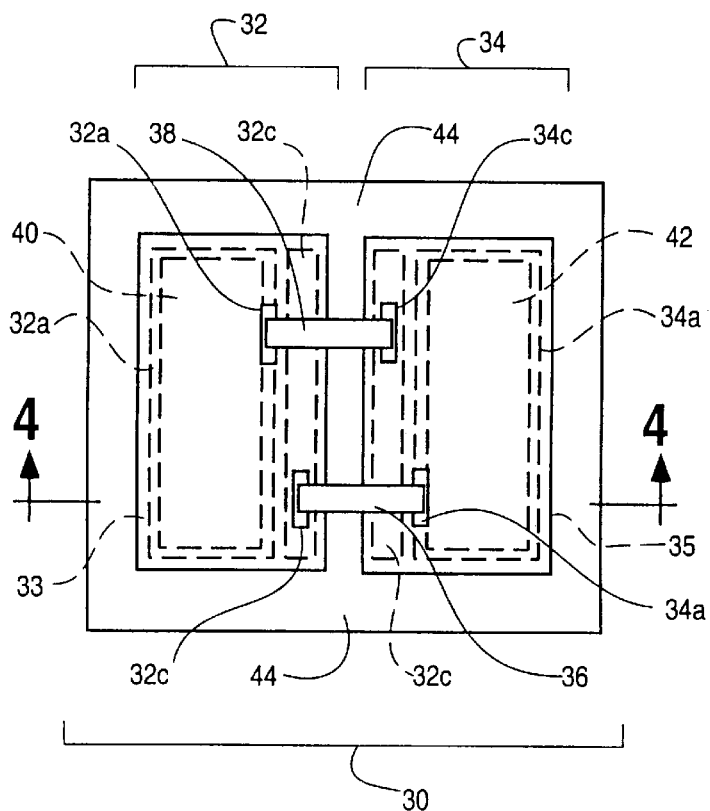
FIG. 3 is a plan view of the OPS-F constructed as a monolithic integrated circuit according to the second preferred embodiment of the present invention.
Figure 4:
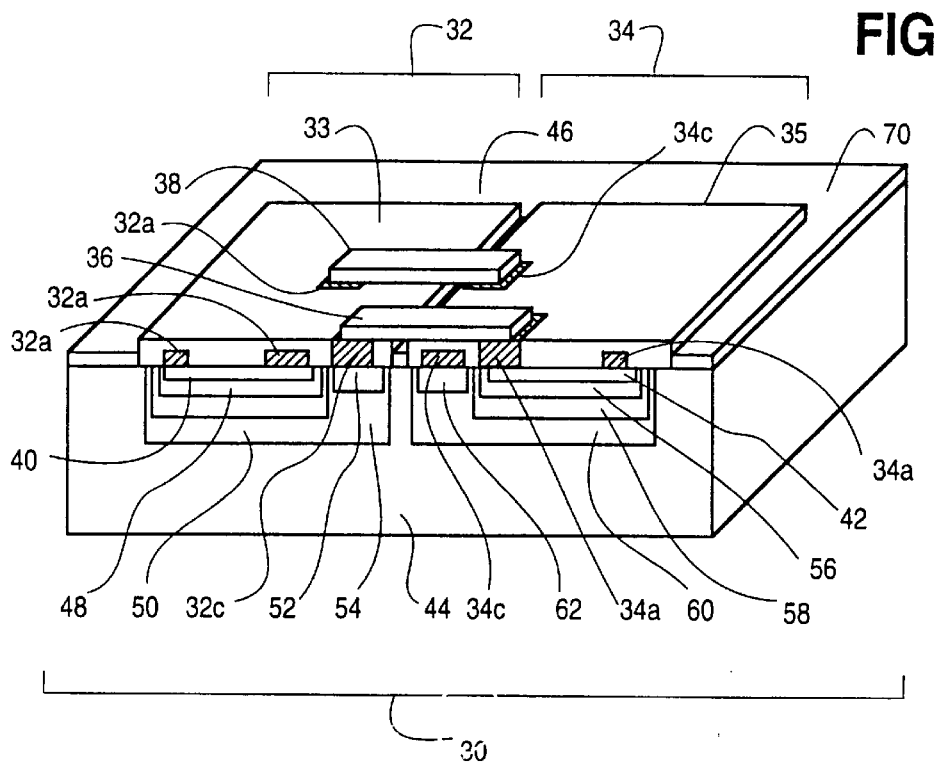
FIG. 4 is a three-dimensional section view of the OPS-F constructed as a monolithic integrated circuit according to the second preferred embodiment of the present invention taken along the plane of line IV—IV of FIG. 3.

Preferably, as shown in FIGS. 3–4, the OPS-F device (30), is constructed as a monolithic integrated circuit. The OPS-F (30) consists of two PIN photodiodes (32,34), the first photodiode (32) filtered with the first bandwidth-portion filter (33), and the second photodiode (34) filter with the second bandwidth-portion filter (35), electrically connected in an inverse parallel manner such that the cathode (32c) of the first photodiode (32) is electrically connected to the anode (34a) of the second photodiode (34) via a first common conductor (36), and the anode (32a) of the first photodiode (32) is connected to the cathode (34c) of the second photodiode (34) via a second common conductor (38). The first bandwidth-portion filter (33) passes a different bandwidth of stimulating light than the second bandwidth-portion filter (35). The voltage-phase developed by the OPS-F (30) is measured from the first common conductor (36) and the second common conductor (38) which are also the output terminals. The voltage-phase developed at the common conductors (36,38) is determined by which of the two photodiodes (32,34) produces a higher voltage which is dependent on the relative illumination which they receive from their respective signal light sources.

For example if the illumination of the entire OPS-F (30) contains a greater proportion of bandwidths that can stimulate the first photodiode (32) than can stimulate the second photodiode (34), then a higher voltage will be developed by the first photodiode (32) than the second photodiode (34), and the voltage-phase measured from the first common conductor (36) will be negative and the voltage-phase measured from the second common conductor (38) will be positive. On the other hand, if the illumination to the entire OPS-F (30) contains a greater proportion of bandwidths that can stimulate the second photodiode (34) than can stimulate the first photodiode (32), then a higher voltage will be developed by the second photodiode (34) than the first photodiode (32), and the voltage-phase measured from the first common conductor (36) will be positive and the voltage-phase measured from the second common conductor (38) will be negative.

In the preferred embodiment of the OPS-F (30) shown in FIGS. 3–4, the P+ surface (40) of the first photodiode (32) has its anode (32a) deposited around the entire edge of the P+ region (40), and the cathode (32c) of the first photodiode (32) is deposited completely over a large area of the N+ region (52) under the cathode (32c). Similarly in the preferred embodiment of the OPS-F (30) shown in FIG. 3, the P+ surface (42) of the second photodiode (34) has its anode (34a) deposited around the entire edge of its P+ region (42), and the cathode (34c) of the second photodiode (34) is deposited completely over a large area of the N+ region (62) under the cathode (34c). The starting P-type silicon substrate (44) is shown surrounding the two photodiodes (32, 34). Although, the starting monolithic silicon substrate (44) for the illustrated preferred embodiment of the OPS-F device (30) of the present invention is undoped silicon (44), those skilled in the art will recognize that P-type or N-type silicon may also be use as a starting monolithic silicon substrate by altering the fabrication of the OPS-F's photodiodes.

As illustrated in FIG. 4, the construction of the OPS-F (30) follows standard semiconductor fabrication processes. PIN photodiodes (32,34) each with a distinct intrinsic layer (50,58) are used in this embodiment because of their wider depletion region and higher switching speeds. A first heavily doped N-region (54) and a second heavily doped N-region (60) are fabricated in close proximity to each other in the starting undoped substrate (44). A first N+ region (52), and a second N+ region (62) are then fabricated in the first N-region (54) and the second N-region (60) respectively. A first heavily doped P-region (48) and a second heavily doped P-region (56) are then fabricated in the first N-region (54) and second N-region (60) respectively. A first intrinsic layer (50) then forms at the junction of the P-region (48) and the N-region (54). A second intrinsic layer (58) then forms at the junction of the P-region (56) and the N-region (60). A first P+ region (40) is then fabricated in the first P-region (48), and a second P+region (42) is then fabricated in the second P-region (56). A first metallic anode (32a) is deposited on the first P+ region (40) on its perimeter to permit a large area of electrical contact and a second metallic anode (34a) is deposited on the second P+ region (42) on its perimeter to permit a large area of electrical contact. A first metallic cathode (32c) is deposited on the entirety of the first N+ region (52) to permit a large area of electrical contact. A second metallic cathode (34c) is deposited on the entirety of the second N+ region (62) to permit a large area of electrical contact. The first wavelength-portion filter (33), which in the preferred embodiment is a multilayer dielectric layer, is deposited on the first photodiode (32). The second wavelength-portion filter (35), which in the preferred embodiment is a multilayer dielectric filter, is deposited on the second photodiode (34).

Filter layers (33,35) each pass a different bandwidth of light within the spectrum from 450 nm to 1150 nm, the spectral response of silicon photodiodes. In the preferred embodiment for example, the first filter layer (33) has a bandwidth pass from 600 nm to 850 nm, and the second filter layer (35) has a bandwidth pass from 850 nm to 1100 nm. Those skilled in the art however will recognize that other bandwidths, both greater and smaller, are also useful.

A silicon dioxide insulating layer (70) is fabricated on the areas of the OPS-F (30) not covered by the filter layers (33,35). Openings are etched in filter layers (33,35) to exposed the anodes (32a, 34a) and the cathodes (32c, 34c). A first common conductor (36) is then deposited to connect the first cathode (32c) to the second anode (34a), and a second common conductor (38) is deposited to connect the first anode (32a) to the second cathode (34c). The common conductors (36,38) also serve as the output terminals (42,40) illustrated in FIG. 2.

Figure 5:
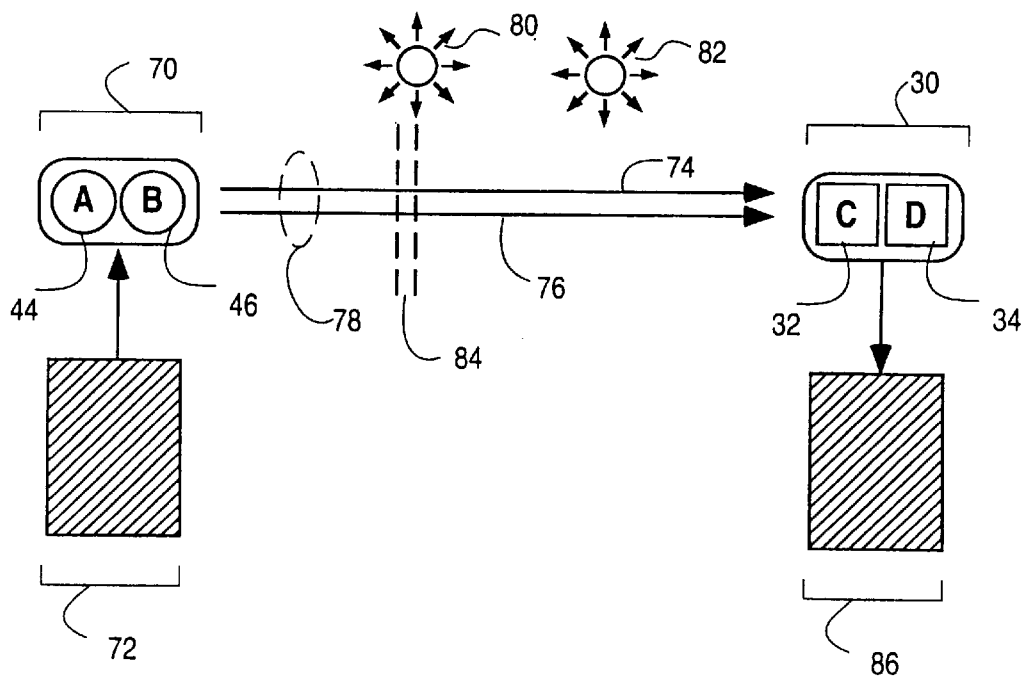
FIG. 5 is a diagram illustrating a TM2/OPS-F combination used for long-distance open-air data transmission ("LDOADT")

FIG. 5 illustrates a TM2/OPS-F combination used for long-distance open-air data transmission ("LDOADT") with characteristic high resistance to background noise, and high data transmission rates. The TM2 (70) is provided signal coding and is powered by a modulated signal generator such as the transmitter (72). The WPSLS-1(44) and the WPSLS-2 (46) of the TM2 (70) include LEDs, lasers, or any light source capable of producing specific bandwidths of light in a rapid pulsed manner. The TM2 digital signal (78), comprised of the first bandwidth signal light ("WPSL-1) (74), and the second bandwidth signal light ("WPSL-2") (76), is highly resistant to common mode noise such as ambient light (80), 60 Hz interference (82), and atmospheric attenuations (84). The TM2 signal (78) is sensed by the OPS-F (30) and differentially converted into positive or negative voltage-phase signals by the first photodiode (32) and the second photodiode (34) of the OPS-F (30). The voltage-phase developed by the OPS-F (30) is decoded and reconstructed by a receiver (86) in an industry standard manner.

For LDOADT applications employing the OPS-F embodiment of the opsistor, by utilizing a different light bandwidth filter over each OPS-F receiver opsistor photodiode, the two transmitter light sources of the TM2 (each producing the specified different bandwidths of light) may be located at a great distance from the OPS-F receiver. In addition the OPS-F receiver may receive serial communication even though the OPS-F device is in motion, such as if placed on rapidly moving equipment, or even if blocked by a light diffuser such as biological tissue. For example, in the latter case, by using red and infrared light as the two TM2 wavelengths that penetrate the skin into subcutaneous tissues, a subcutaneously implanted OPS-F sensor may receive serial communications via an external TM2 transmitter to provide power and programming to an implanted drug delivery pump.

The advantages of the TM2/OPS-F combination device of this invention for LDOADT are appreciated when compared to the current art for LDOADT. Typically in the current art, a transmission LED is modulated at a carrier frequency approximately 15× higher than the target data rate or baud rate. For example, in remote control and low speed serial PC-IR links, a carrier frequency of about 38 KHz is used to transmit signal bursts to the receiver. The presence of a burst is interpreted as one logic state and the absence its compliment. By timing the signal burst properly in real time, an equivalent data rate of 300 to 2400 baud can be reliably achieved. Newer standards today for PCS have improved this data rate to over 100 kilobits per second but the working distance is just a few feet.

Signal integrity between transmitter and receiver must negotiate ambient light levels and changing attenuation. Even with bandpass filters and signal processing, the transmission rates must be compromised to obtain the required signal to noise margin over background. Signal variations from ambient behave similar to dynamic voltage offsets to the IR carrier signal and can be categorized as "noise." Depending on the receiver circuit, the maximum data rate reliably received is limited by the signal to noise ratio possible, the better the quality of the incoming signal, the faster will be the possible data rate. With open air applications ambient noise is highly dynamic, and ample guardband is reserved to ensure reliable data transmission under all conditions.

In contrast to, for example, an intensity amplitude modulated transmitter LED and a single photodiode receiver, the TM2/OPS-F combination for LDOADT applications uses an active wavelength alternation method utilizing two separate color LEDs for transmitting logic ones and zeros to produce a voltage-phase modulation. This TM2 bi-phasic drive system transmits two wavelengths alternately to produce the effect of a carrier signal at the OPS-F receiver. For example, if GREEN and RED were the two bi-phasic wavelengths, GREEN is ON during the positive excursion of the carrier and RED is ON during the negative excursion of the carrier. These PUSH-PULL excursions are recognized as positive or negative voltage-phases at the OPS-F. This bi-phasic approach causes all ambient factors to be regarded as common mode and to therefore become automatically canceled at the OPS-F input. Normal signal processing now converts the carrier into a digital data stream. A gain of better than 20 dB in S/N is obtained with the TM2/OPS-F combination. Faster data transmission and longer transmitter-receiver distances are obtainable.

Figure 6:
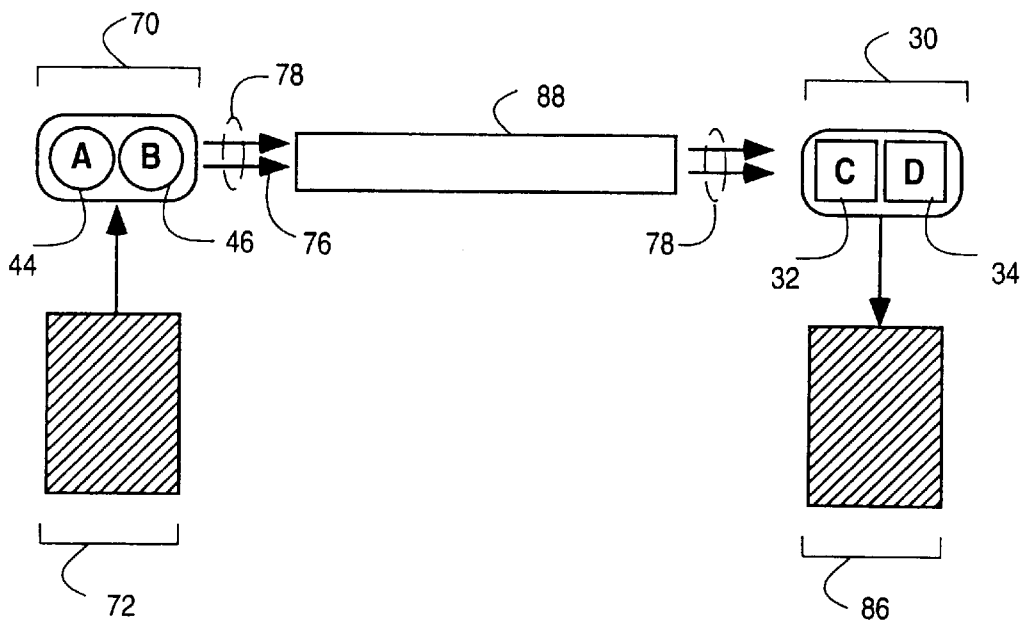
FIG. 6 is a diagram illustrating a TM2/OPS-F combination used in conjunction with a fiber optic for high-speed fiber optic data transmission ("HSFODT")

FIG. 6 illustrates a TM2/OPS-F combination used for High-Speed Fiber Optic Data Transmission ("HSFODT") with characteristic high data transmission rates, and high resistance to fiber attenuations. The TM2 (70) is provided signal coding and powered by the transmitter (72). The WPSLS-1(44) and the WPSLS-2 (46) of the TM2 (70) include LEDs, lasers, or any light source capable of producing specific bandwidths of light in a rapid pulsed manner. The TM2 digital signal (78) comprised of the first bandwidth signal light ("WPSL-1") (74) and the second bandwidth signal light ("WPSL-2") (76) is highly resistant to fiber attenuations such as from temperature effects, mechanical stress, impurity/defect effects, and water absorption during passage through the conduit optical fiber (88). The TM2 signal (78) is sensed by the OPS-F (30) and differentially converted into positive or negative voltage-phase signals by the first photodiode (32) and the second photodiode (34) of the OPS-F (30) The voltage-phase developed by the OPS-F (30) is decoded and reconstructed by the receiver (86) in an industry standard manner.

The advantages of the HSFODT use of this invention are apparent from comparing it against current art technology. In the current art, a laser source is use to serially transmit monochromatic light signals through an optical fiber to a PiN or avalanche type photodiode detector. Data rates from 20 Mbits/second to Gigabits/second are possible with the proper combination of optics and electronics. With high-end technology applications like telecommunication, factors such as wavelength selection, multimode fibers, low loss connectors, repeaters, and low noise detectors are optimized to achieve the best possible performance. This performance, however, can be further improved if factors such as temperature stress, mechanical stress, and fiber imperfections can be converted into common mode parameters.

By utilizing bi-phasic TM2 drive and OPS-F bi-phasic opsistor detection, the signal-to-noise ratio of a fiber link can be improved as compared to the current art. This increase allows the use of longer span distances between repeaters and/or increased data transmission rates. The majority of noise variables within a fiber are predominantly single-ended or ground referenced. An example is attenuation variations from micro mechanical stresses along a fiber experiencing temperature fluctuations or vibration. The TM2/OPS-F combination used for HSFODT permits balanced signal detection around zero volts. In this approach, a positive voltage vector is a Logic One while a negative voltage vector is a Logic Zero. A DC-coupled amplifier can be used that eliminates many capacitor-related issues (e.g., phase and time delays) for processing ultra-fast signals. Balanced detection also eliminates the need to store a reference voltage (usually by a capacitor) for use in comparing input signals to test for Logic One or Logic Zero. Higher data transmission rates can be achieved that increase the information bandwidth of a fiber.

With lower technology applications such as computer network fiber links, improvements in the signal-to-noise ratio will allow greater tolerance to fiber imperfections. This in turn can lower fiber cost for consumer applications. One such application may be usage of a lower grade fiber for connection into single family homes that satisfies the required data bandwidth but has higher cost effectiveness.

There are several advantages for using the opsistor wireless transmitter/receiver in FIG. 5 or in the fiber optics transmitter/receiver in FIG. 6. The opsistor detector 30 and transmitter 70 use a balanced AC energy transmission protocol. This method extends the frequency range of photodiode operation because logic detection is now based on polarity and duty cycle and not on absolute signal amplitudes. Each cycle of opsistor data transmission is balanced and will see two returns to ground potential (zero energy state). This method of data transmission is known as Return-To-Zero (RTZ). This permits fast data logic transitions around zero crossing and signal symmetry to ground. Signal symmetry to ground is necessary for high speed opsistor operation. Normal signal processing depends on a DC dynamic reference that must continuously track the mean of the input signal. This severely limits the available bandwidth. The opsistor signal, by comparison, is always symmetric and stable around ground for maximum data bandwidth.

Figure 7:
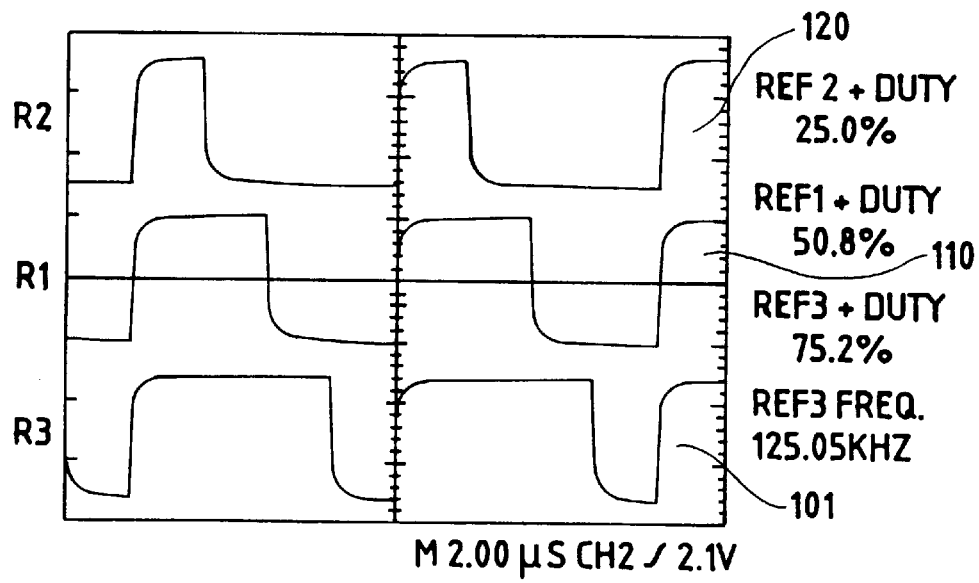
FIG. 7 is a waveform trace of the master waveform profiles according to the present invention.
Figure 8A:
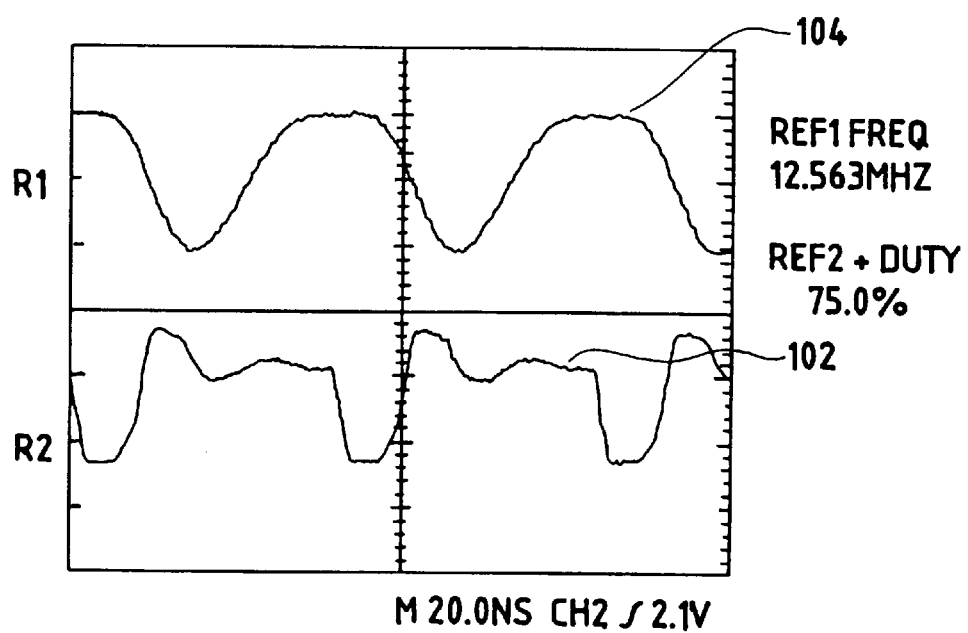
FIG. 8A–8C are waveform traces of transmitter signals and opsistor detector outputs of the master waveform profiles of FIG. 7.
Figure 8B:
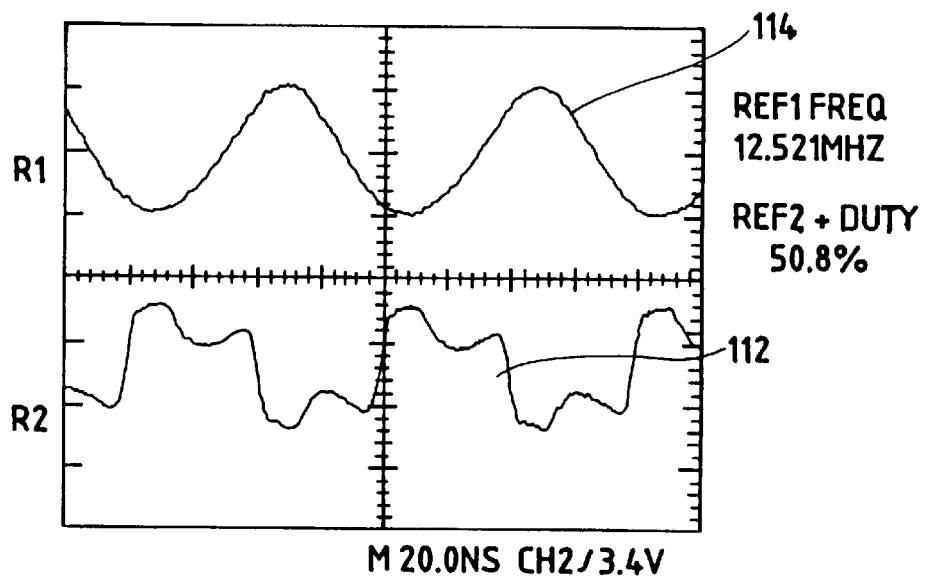
Figure 8C:
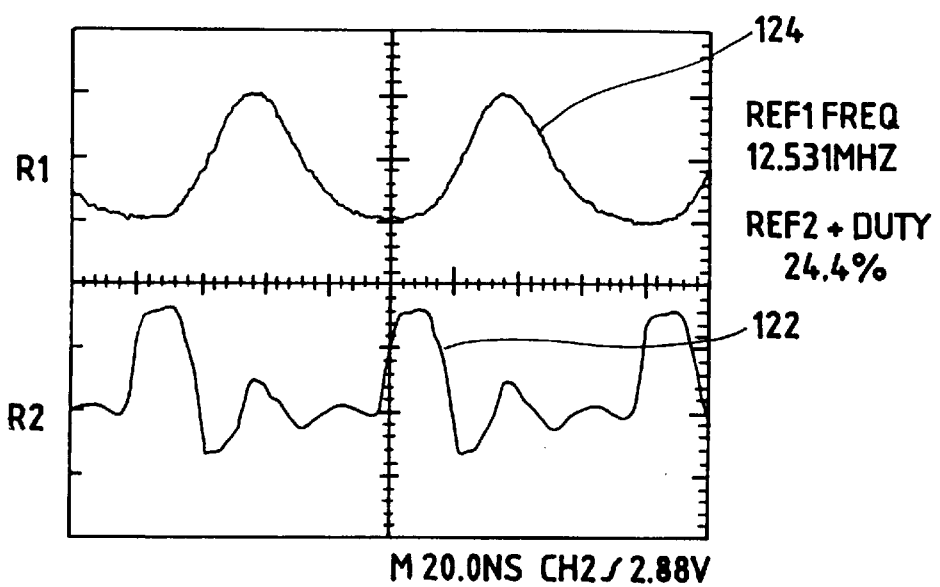

An opsistor modulated signal generator, such as transmitter 70, supports three distinct "master" waveform profiles as shown in FIG. 7 and FIGS. 8A–8C which are used to modulate data. Each master profile is distinguished by its average DC signal value and its duty cycle reference to ground. The profiles shown in FIG. 7 are differentiated by the average DC value of each profile. Trace 100 (Profile A) represents a specific duty cycle of 75% which results in an average positive DC signal value. FIG. 8A shows the 75% duty cycle trace 102 at the transmitter 70 which results in a waveform 104 at the output of the opsistor detector 30 in either FIG. 5 or 6. This is characterized by positive average value and long time delta for the midpoint zero crossing. Similarly, trace 110 (Profile B) represents a specific duty cycle of 50% which results in an average zero DC signal value. FIG. 8B shows the 50% duty cycle trace 112 at the transmitter 70 which results in a waveform 114 at the output of the opsistor detector 30. This is characterized by zero average value and 50% midpoint zero crossing. Trace 120 (Profile C) represents a specific duty cycle of 25% which results in an average negative DC signal value. FIG. 8C shows a 25% duty cycle trace 122 at the transmitter 70 which results in a waveform 124 at the output of the opsistor detector 30. This is characterized by negative average value and short time delta for the midpoint zero crossing. The transmitter energy is equalized for each profile to ensure constant peak signal amplitudes. Any profile may follow another profile without loss in symmetry or balance to ground.

Only the DC average value and waveform duty cycle effect the encoding of the master logic profiles in FIG. 7. At higher data transmission speeds, typically above 100 Megabits per second, parasitic or stray impedances (capacitance and inductance) may introduce a DC shift into the opsistor receiver 30. This DC component can disrupt the symmetry of the received signal and interfere with data interpretation. At these high transmission rates, a 50% duty cycle wavelet code is interweaved at specific intervals into the data stream to test for DC shifts. The opsistor receiver 30 monitors these bursts of 50% waveforms and adjusts its internal gain to compensate for any detected DC offsets as will be explained below. At lower speeds, DC shifts are insignificant and compensation unnecessary.

Each master profile can be further divided into sub profiles. Sub profiles are encoded by varying the period of a master profile in fixed amounts. Nine unique sub profiles are possible with each of the A, B and C master profiles. This protocol has 27 unique profile waveforms used for data transmission as will be explained below.

Since optical energy received by the opsistor detectors 32 and 34 is phase correlated for the three master waveform profiles, random energy falling onto the opsistor receivers 30 is sensed equally by detectors 32 and 34. In highly critical applications, the two opsistor detectors 32 and 34 can be fabricated using a "checkerboard" like pixel pattern. All "black detectors" are paralleled as one detector A while all "white detectors" are likewise paralleled as one detector B. This checkerboard pattern effectively averages any minor variations that might be caused by spatial displacement of the A and B opsistor photodiodes.

This checkerboard arrangement in FIGS. 5 and 6 prevents problems that may be present with a single photodiode detector. Such a detector senses noise from 60 cycles or obscurations in the atmosphere, both of which can force bit rate errors. In the opsistor transmitter/receiver in FIGS. 5 and 6, however, greater than 35 dB rejection reduces this problem significantly. The output of the detectors 32 and 34 is always at 0 volts (ground state) whenever illumination to both are equal. In this specific situation, the photovoltaic voltages generated by the A and B detectors 32 and 34 will be canceled. This is very important in signal processing for minimizing input sensor response to unwanted signal sources. The better this background noise rejection is, the easier it becomes to sense a weak optical signal from background noise. High common mode rejection results in excellent detector stability for many applications used in "open air" or "liquid" media data transmission.

Figure 9:
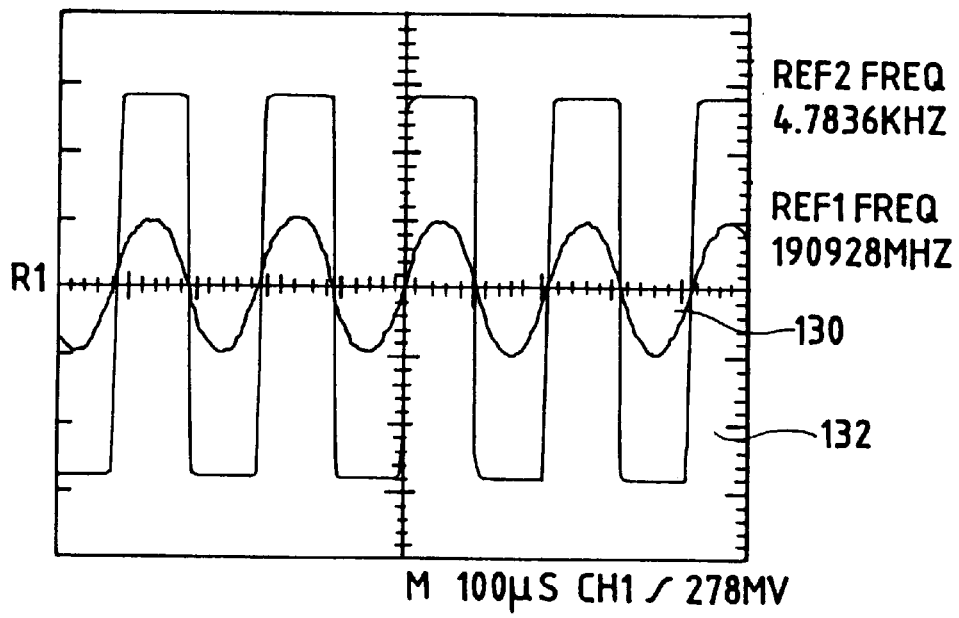
FIG. 9 is the waveform trace of the opsistor output signals.

Each opsistor photodiode detector 32 or 34 acts like a dynamic load for the second opposing photodetector 34 or 32. Instead of slow fall times typical of a single ground referenced photodiode, the active opsistor photodiode forces fast response from the opposing "off-state" photodiode. This technique produces a highly symmetric and stable AC output signal referenced around ground shown in FIG. 9. FIG. 9 shows a trace 130 which represents the opsistor waveform with symmetrical rise and fall times as a function of frequency. An opsistor waveform holds its symmetry around ground as frequency is increased. A square wave trace 132 is the input driving the opsistor transmitter 70. The trace 130 is a sinusoidal waveform representing the received signal sensed by the opsistor receiver 30 showing excellent symmetry around ground. At a high frequency, a single diode waveform is highly assymmetric with differing rise and fall times. Since parasitic effects are suppressed by the opsistor detector, performance may be from five to twenty times more reliable than a single diode detector depending on the particular application.

The excellent symmetry allows the opsistor transmitter to perform waveform compression. This symmetry also allows relatively low cost detectors to receive optical signals well into the megahertz range.

Opsistor technology is based on a PUSH—PUSH approach to transmitting optical data. An energy burst is transmitted for a positive signal as well as for a negative signal. These two energy streams, E and [E], must be discriminated so that the detector 32 will respond only to energy stream E and not to [E]. The use of polarized light sources is one method to achieve this effect. With conventional LED transmissions, only one energy beam is used. Coding is very simple. The presence of energy is Logic O and the absence, Logic Z. Under like conditions, the PUSH—PUSH transmission in the opsistor system will produce 6 dB (2x) more signal at the detector 32 than single LED transmission since the two doses of energy are being transmitted 180 degrees out of phase. The positive energy light pulls the detector 32 to [+ V signal] followed immediately by light pushing the detector 32 to [−V signal]. The resulting sensor output is therefore 2 V (+V signal−[−V signal]). By comparison, a single photo detector has only one On/Off light source that limits the output to 1 V (+V signal−[ground]). The opsistor will therefore benefit from twice the signal amplitude at comparable transmission distances.

The gain is also realized at the internal circuitry of the opsistor which is the most efficient stage for gain application. Since signal strength is stronger at the earlier stages in the amplification circuit, less gain is required for a desired output. In the opsistor, therefore, the 6 dB increase in signal directly at the sensor results in efficient gain. Stronger input signals mean better signal to noise ratios and increased working distances between opsistor transceivers.

Opsistor transmission rates can be varied "on-the-fly." Depending on signal quality and distances between transceiver units, the synchronous clock rate is automatically "throttled" to achieve maximum data throughput. For Infrared Data Association (IrDA) links in personal computers, this can be a strong advantage for the fastest possible file transfer.

Opsistor transmission bandwidth may be inherently enhanced through the use of distinct runlength data compression based on the master profiles in FIGS. 7–8. This is possible since the cycle time of the three master waveform profiles (A, B, C) can be varied in real time. This variation has no effect on average power or peak signal levels. Each of the waveform profiles (A, B, C) can be varied from one normal period to three times the normal period in ¼ period increments. This creates 9 sub profiles out of each master profile for 27 unique profile signatures.

The number of maximum profiles is determined by the incremental value offered with each profile. With opsistor profiles (or wavelets) differing by ¼ of a cycle between wavelets, the optimum word length for compression is 4 bits. With four bits of binary data, two clock cycles are required to transmit the 4 bits. Sixteen possible 4 bit combinations are possible. At ¼ wavelet intervals, 15 wavelets are available with compression multiples of 1.0 or more. Only the 16th wavelet reserved for data compression has a compression multiple of less than 1.0. This is a ratio where the average data compression will range from 1.3 to 2.0 times. If finer wavelet resolutions were possible to allow enough wavelet patterns, all binary combinations would see compression gains. This may be possible with higher generations of opsistor compression with greater than quarter cycle resolution.

With wavelet resolution at ¼ cycle, a 4 bit binary pattern is the optimum. A nine-wavelets set per master waveform is selected because additional wavelets are required to code supporting protocols. These special codes are used to more efficiently deal with long data redundancy (discussed below). The more these codes are used, the greater the data repetition and the higher the compression factor.

With the compression technique of the present invention, all input data are processed as 4 bit nibbles using the 27 subprofiles derived from the three master profiles. The first 16 opsistor profiles are reserved to encode the 16 possible logic sequences of a 4 bit string. The remaining 11 opsistor waveform profiles are used to encode single 0, single 1, single space, and 8 multipliers from 3× to 10×.

Each protocol wavelet is uniquely defined and cannot be confused with another. When a protocol wavelet is cascaded with data, functions such as multiplication scaling are achieved. A wavelet used to encode 0000 (a 4 bit nibble of zero's) could be repeated many times by simply tagging on one or more multipliers to the end of this nibble. Multipliers can be sent in a chain to encode long sequences of identical patterns. For example, a nibble of 0000 followed by X2, X50 and x100 multipliers would be equivalent to a run of 10,000 zeros. This type of nibble is key to opsistor compression since the zero nibble dominates over all other binary states. Single bit states for bit level 1, bit level 0 and "space" are all individual wavelets. These wavelets are typically used to encode remnant bit lengths of 3 bits or less.

Any opsistor waveform profile can follow another profile without degrading the ground reference integrity. Opsistor compression yields an additional factor of 1.3 to 2 times in lossless compression even with a fully compressed data stream. On the other hand, a highly redundant data string such as a "white" line 8 inches long at 500 dpi (4,000 bits) can be compressed with only 4 opsistor cycles (4 zero bits; x10, x10, x10). An 8 inch long blank line at 500 dpi will contain 4,000 bits (8×500). The opsistor compression algorithm will use one wavelet to encode 0-0-0-0, then followed by three wavelets encoding three multipliers. Multiplier wavelets can be cascaded together to achieve many multiplication factors. In this example, three x10 multiplier wavelets are used for a multiplication of 1,000. In decoding, the 0-0-0-0 nibble pattern is repeated 1,000 times for the equivalent of 4,000 zeros. If the multiplication factor cannot directly encode the full repetition, standard wavelets would immediately follow the third multiplier. For example, if the actual zero run length was 4,004 bits, the next wavelet after the three multipliers would simply encode 4 zeros. As a reference point, only 22 standard data bits can be sent in this same amount of time.

Opsistor data transmission is governed by three fundamental waveform profiles as discussed earlier. Each principal profile can be encoded further into 9 sub profiles by varying the period in ¼ period cycles. Subprofile #1 has a duration of one full period or four ¼ cycles. Subprofile #2 is at 1¼ cycles, subprofile #3 is at 1½ cycles, and so forth until subprofile #9 with a duration of exactly 3 cycles. The profiles thus have the following cycles.

| | |
|---|---|
| Profile #1 = 1 | cycle |
| Profile #2 = 1¼ | cycles |
| Profile #3 = 1½ | cycles |
| Profile #4 = 1¾ | cycles |
| Profile #5 = 2 | cycles |
| Profile #6 = 2¼ | cycles |
| Profile #7 = 2½ | cycles |
| Profile #8 = 2¾ | cycles |
| Profile #9 = 3 | cycles |

Figure 10:
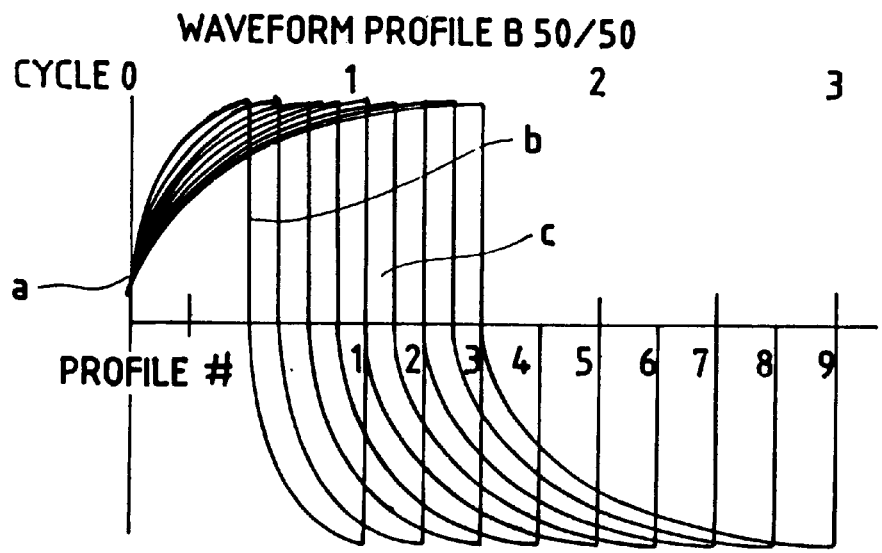
FIG. 10 is the waveform trace of 9 possible 50% duty cycle profiles tied to master profile B from FIG. 7.

As an example, FIG. 10 shows all of the 9 possible 50% duty cycle profiles tied to master profile B. Point a to point c is the first sub profile of master profile B (50% duty cycle waveform signature). The successive profiles #2 through #9 each have ¼ cycle extensions in cycle periods to make each unique. The lower profiles #1 to #5 can store between 2 to 4 bits per clock frame and are reserved for encoding combinations of four-bit patterns as was explained above.

The fundamental period of the waveform profile B is a minimum of 4 clock quadrants (from point a to point c). This specific period of 1 frame at 50% duty cycle is reserved for only one 4 bit nibble pattern (specifically 1011). Therefore in one clock cycle (which only holds 2 bits under standard compression), this opsistor waveform carries 4 bits of information for a 2 time compression factor. Not all the opsistor profiles, however, are this efficient.

A four (4) bit nibble pattern can only have 16 combinations. Sub profiles from Waveforms A, B and C sum together for 27 (3×9) possible encoding combinations. Of these 27 profiles, 16 are reserved to store the 16 possible combinations of the 4 bit nibble. Profiles #1 to #4 (FIG. 10) are all more efficient than 2 data bits per full clock cycle. Profile #5 breaks even exactly at 2 bits per full clock cycle. Profiles #6, #7, #8, and #9 are slightly worse with Profile #9 at 1.5 bits per full clock cycle. Again, this assumes that competitive systems will transmit two data bits for every clock cycle.

All the high efficiency profiles are reserved for the 16 possible 4 bit combinations. This produces the best compression possible for all file types. Fifteen of these 16 profiles have compression factors that are at or better than one. Only the 16th profile has a slight inefficiency at 0.88. At worst case, the average compression factor will never drop below 1.33 times.

The balance of the 11 profiles are reserved for other functions that absorb longer clock cycles without compression loss. Eight of these profiles are used for multiplication factors from 3 to 10 times. Any repetitive 4 bit pattern can be encoding using a profile followed by one, two or more multipliers. With two multipliers, 4 bit pattern repeats may be repeated up to 100 times with multipliers of 11 to 99 (supported multipliers are 12, 15, 16, 18, 20, 21, 24, 25, 27, 28, 30, 32, 35, 36, 40, 42, 45, 48, 50, 54, 56, 60, 63, 70, 72, 80, 90, and 100). The remaining three profiles are used for single 0, single 1 and single space.

Thus, the opsistor compression technique will compress any data stream even if the data is already fully compressed. Compression factors will range from 1.3 to 10 times (or better) depending on how compressed the file is originally. Normal Huffman compressed files will typically see another two times increase in compression if transmitted using opsistor hardware.

Figure 11A:
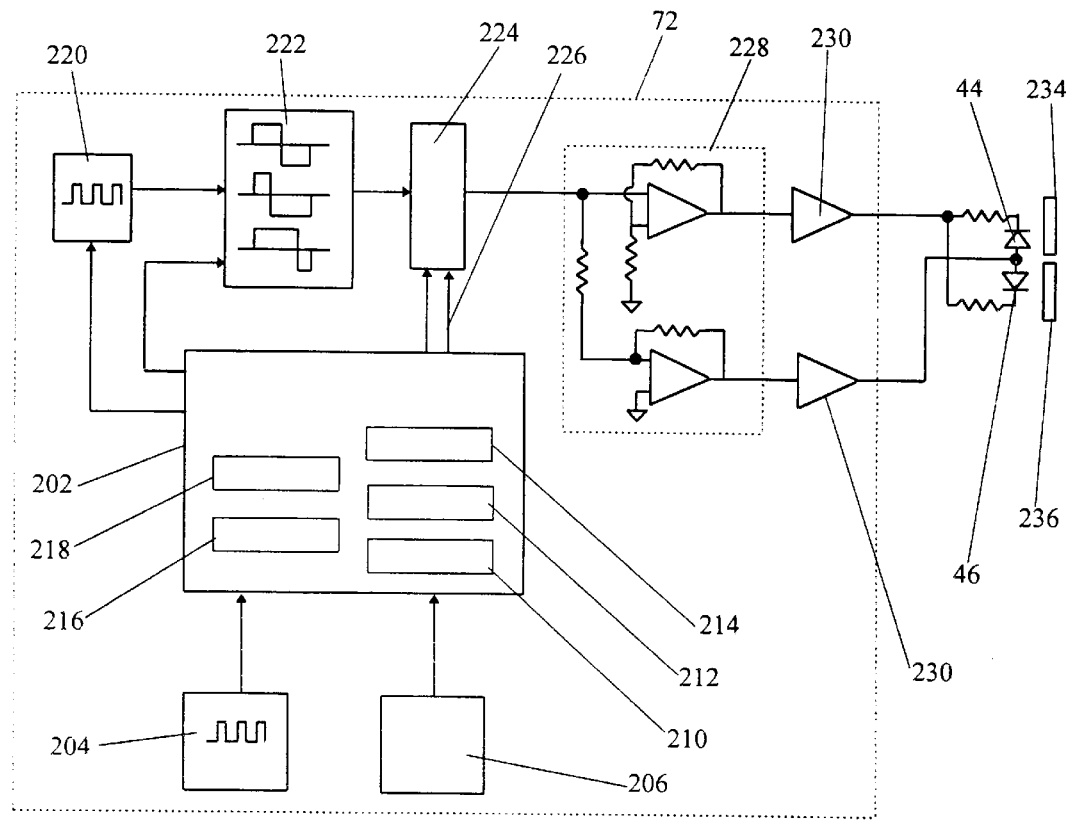
FIGS. 11A and 11B are block diagrams of a compression waveform transmitter and receiver which is used in conjunction with the combinations in FIGS. 5 and 6.
Figure 11B:
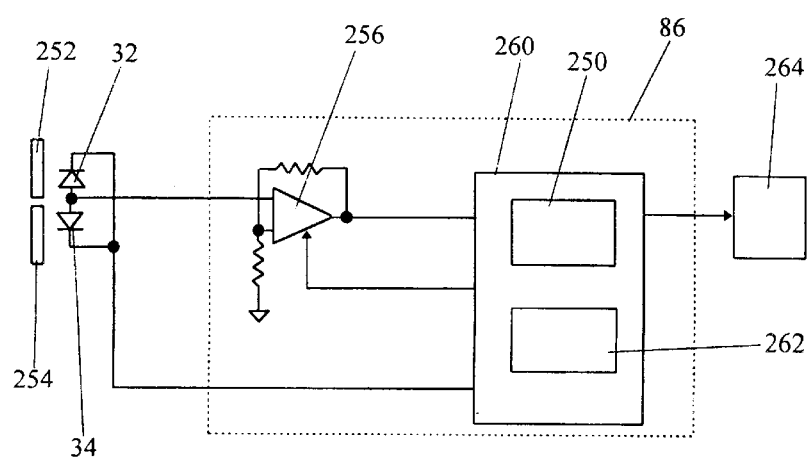

The above described method may be implemented by a variety of hardware and software. FIGS. 11A and 11B show a transmitter/encoder and a decoder receiver circuit which may implement the master waveform compression scheme. FIG. 11A is a block diagram of a modulated signal generator such as the transmitter 72 in FIGS. 5 and 6. The compression transmitter 72 includes a discrete ASIC 202 which serves as a signal processing circuit in the preferred embodiment. Alternatively, the transmitter may be directly synthesized using a computer or microprocessor. The ASIC 202 is run by a system master clock 204. The ASIC 202 accepts data from a digital input source 206. The digital input source 206 provides any type of digital information which is desired to be transmitted and may include audio, video, data etc. The ASIC 202 has a data buffer circuit 210, a field buffer circuit 212, a compression matching circuit 214, a wavelet selection circuit 216 and a protocol imbedding circuit 218. The ASIC 202 is coupled to a variable quadrant clock 220.

The ASIC 202 is coupled to a permanent memory such as ROM 222 via an enable line. The variable quadrant clock 224 provides clock rates in increments of quarter cycles and is also coupled to the ROM 222. The ASIC 202 is also coupled to a waveform generator 224 via a pair of master waveform select lines 226.

In the transmitter 72, the three basic master waveforms shown in FIGS. 7 and 8 are pre-equalized and stored in ROM 222. This approach allows the waveforms to be "played back" at various clock rates by the waveform generator 224. Since the waveforms stored in ROM 222 are digitally synthesized, they are inherently locked to the master clock 204 at all times which determines the system clock cycles. Precise waveform generation is thus completely under the control of the ASIC 202. The master waveform are selected using the control lines 226 by the ASIC 202. In this configuration, any wavelet waveform can follow another wavelet waveform without loss in synchronization.

All 25% and 75% wavelet waveforms are equalized for each duty cycle to preserve average power symmetry around ground (as sensed at the receiver). Transmission equalization is performed by increasing the voltage amplitudes of short duration segments in the 25% and 75% wavelets. This enables shorter waveform segments received at the receiver 86 to have faster time constants (quicker charge up or charge down). Balanced 50% wavelets do not require equalization.

The end result is a received waveform composed with various duty cycles but always exhibiting a zero average power around ground. This ensures that all wavelet voltages will return to zero volts at the end of that wavelet cycle. Ground reference decoding simplifies electronics by eliminating DC references and bias circuits.

The wavelet signal from the waveform generator circuit 224 is then preamplified by a preamplifier 228 to produce two bipolar complementary outputs. Each complementary output, E and [E], is further amplified by amplifiers 230 to drive two light emitters such as transmission LEDs 44 and 46. The LED 44 is then polarized in the vertical plane by a vertical polarizer 234 while LED 46 is polarized in the horizontal plane by a horizontal polarizer 236 to provide the two light waveband signals.

Polarization is one possible method to achieve light differentiation. Even though the polarizers attenuate some of the light energy, this method has the advantage of using only one wavelength. A single wavelength is the easiest method for matching the A and B sides of an opsistor transceiver. This technique is low cost and ideal for applications like IrDA "open-air" data transmission. Better common mode performance will translate directly into improved data rates with longer working distances. Of course other light sources such as lasers, infra-red emitters, etc. may be used for the LEDs 44 and 46.

The waveform generator 224 is driven by the ASIC variable clock 220 which is controlled by the ASIC 202 to generate the appropriate wavelengths for coding the data. The ASIC 202 performs data storage, FIFO (first in, first out) data buffering, compression encoding, wavelet selection and protocol embedding. All of these functions are commonly used within data compression integrated circuits. An alternative for the ASIC engine is an ASIC-type programmable gate array (state machine) where the opsistor compression functions are embedded.

FIG. 11B shows a signal receiver such as the receiver 86. The opsistor photodiode pair 32 and 34 detect the polarized light from the transmitter 70 through a vertical polarizer 252 and a horizontal polarizer 254. One output of the photodiode pair 32 and 34 is referenced to ground or another reference voltage on an ASIC 250. The other output of the photodiode pair 32 and 34 is coupled to the input to an analog amplifier 256. The gain of this amplifier 256 is controlled by the compression decoder ASIC 250. The ASIC 250 thus adjusts the gain to compensate for any DC offsets. The ASIC 250 has a wavelet identification circuit 260 and a data buffering circuit 262. The output of the variable gain amplifier 256 is input into the ASIC 250. The ASIC 250 identifies each wavelet profile and converts it back into a binary data stream.

Data buffering is provided by the buffering circuit 262 in the ASIC 250 to accommodate timing differences between the input data rate and the decoded binary output. Direct memory access or DMA techniques are used to move data from the ASIC 202 into a system memory 264 rapidly.

An opsistor transceiver module can be built by combining an opsistor transmitter and an opsistor receiver similar to those described above. Such transceivers may be used for both transmitter 72 and receiver 86. In such a configuration, the ASIC processor is common to both transmit and receive functions. The full package is extremely compact and may be fit within portable equipment such as laptop computers.

Figure 12:
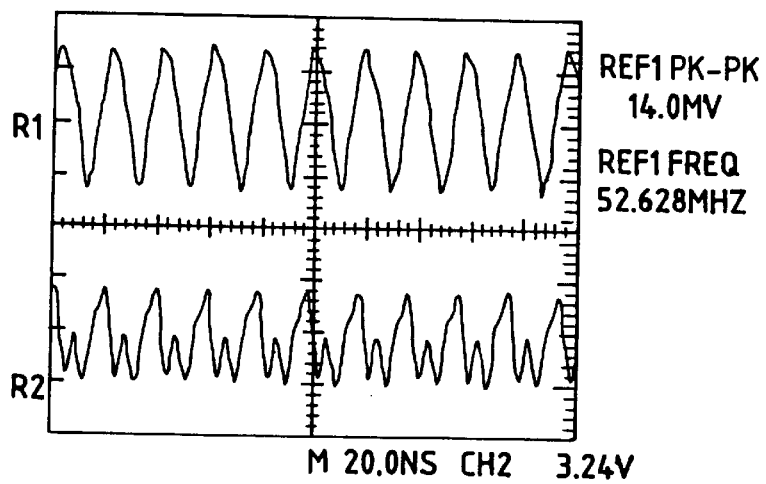
FIG. 12 is a waveform trace of a tone detection system generated according to the present invention.

The opsistor receiver can work equally well under carrier tone detection. FIG. 12 shows a transmitted carrier waveform 140 in tone detection mode. The waveform 140 is received by the opsistor as a waveform 142 with good signal amplitude. In this example, if a Logic Zero (No tone) and a Logic One (YES tone) have durations of 50 clock cycles, a 50 MHZ carrier can transmit up to 2 Mbit/sec. of pulsed tone data. In open air applications, data transmission can switch to tone when distances are beyond reliable synchronous detection. The opsistor with signal amplifiers can detect fixed frequency tones in over 100 dB of noise. The 6 dB gain advantage also benefits tone detection for maximum possible performance.

In an opsistor Infra-red Data Association (IrDA) link, tone and synchronous detection can be integrated to work together. The additional 6 bB opsistor detector front end gain permits better working distances. A faster and more tolerant "open-air" IrDA standard is feasible using opsistor detectors. Capabilities can span up to several meters and a variable clock maintains the best data rates at all times. Transmitted bandwidth can slew from 2 Kilobits per second to 50 Megabits per second.

Figure 13:
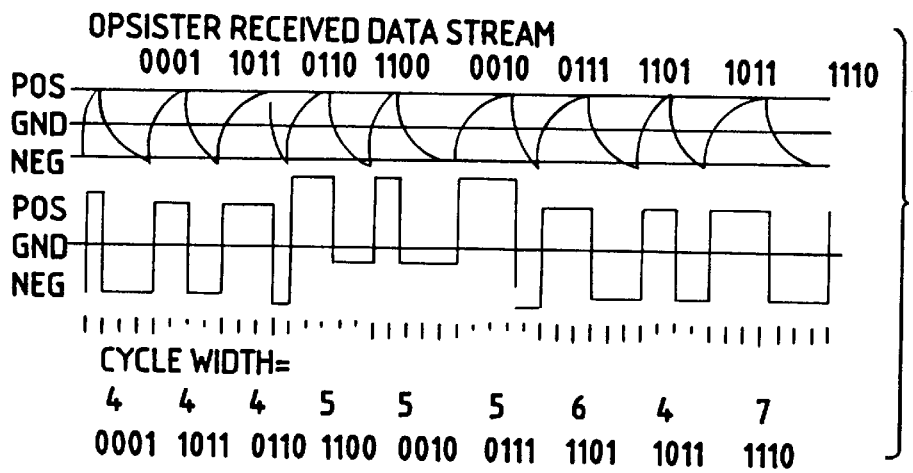
FIG. 13 is a waveform trace of the data stream using the compression technique according to the present invention.

An example of a transmitted data stream from transmitter 70 in either FIGS. 5 or 6 is shown in FIG. 13. The two light sources 44 and 46 are driven in a complimentary fashion (two single ended drivers can also be used). Light pulses are transmitted at various duty cycles under compression. For 25% and 75% duty cycles, the peaks of the light pulses are equalized to preserve zero energy balance. This ensures that opsistor signals will always have an average DC value of zero. The peak to peak amplitude of the opsistor signal, however, will vary as transmitter distances change. Thus, the variation in duty cycle and period width are used to encode the 27 waveform profiles explained above.

The transmission data is represented by the bottom binary pattern in FIG. 13. In the first nibble, the 0001 pattern is encoded with a 25% opsistor wavelet occupying 1 full clock cycle or 4 quadrants. Normally, only 2 binary bits can be transmitted in one clock frame (4 quadrants). The pattern therefore produces a 2 times compression gain for nibble #1. Similarly, the next two nibbles are also coded with 4 quadrant opsistor wavelets. Nibble #2 is encoded with a 50% wavelet at 4 quadrants and Nibble #3 with a 75% wavelet also at 4 quadrants. Nibble #4, however, is encoded with a 5 quadrant 50% wavelet. This pattern continues for the balance of the data string. The data encoded with each wavelet is shown above in the individual wavelets. This data pattern is identical to the binary pattern being transmitted shown below the quadrant count of each wavelet. In total, 9 nibbles (36 binary data bits) that normally would require 18 clocks to transmit were transmitted by opsistor compression in only 44 quadrants or 11 clocks. The average compression gain is 1.64 times (18/11).

Figure 14:
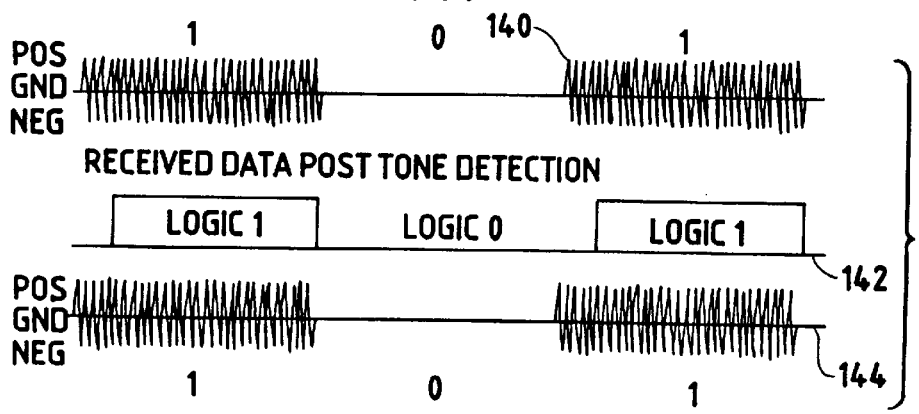
FIG. 14 is a waveform trace of tone transmission using an opsistor transmitter.

Tone transmission may be used when transceiver distances go beyond the range of synchronous operation. An example of tone transmission is shown in FIG. 14. A bottom trace 140 in FIG. 14 shows the data stream transmitted by the light sources 44 or 46. The data is translated into logical values of 1 or 0 after tone detection as shown in a middle trace 142. The top trace 144 in FIG. 14 shows the received tone data stream detected by detectors 32 and 34. Data bit rates can vary between 300 Baud to over 100 KBaud. At slower speeds, there is more time to process a signal and transmission is also more reliable. With a fundamental tone frequency, detection circuits can extract this signal at over 100 dB of noise. The opsistor transmitter and receiver will function in both tone and synchronous modes.

Figure 15:
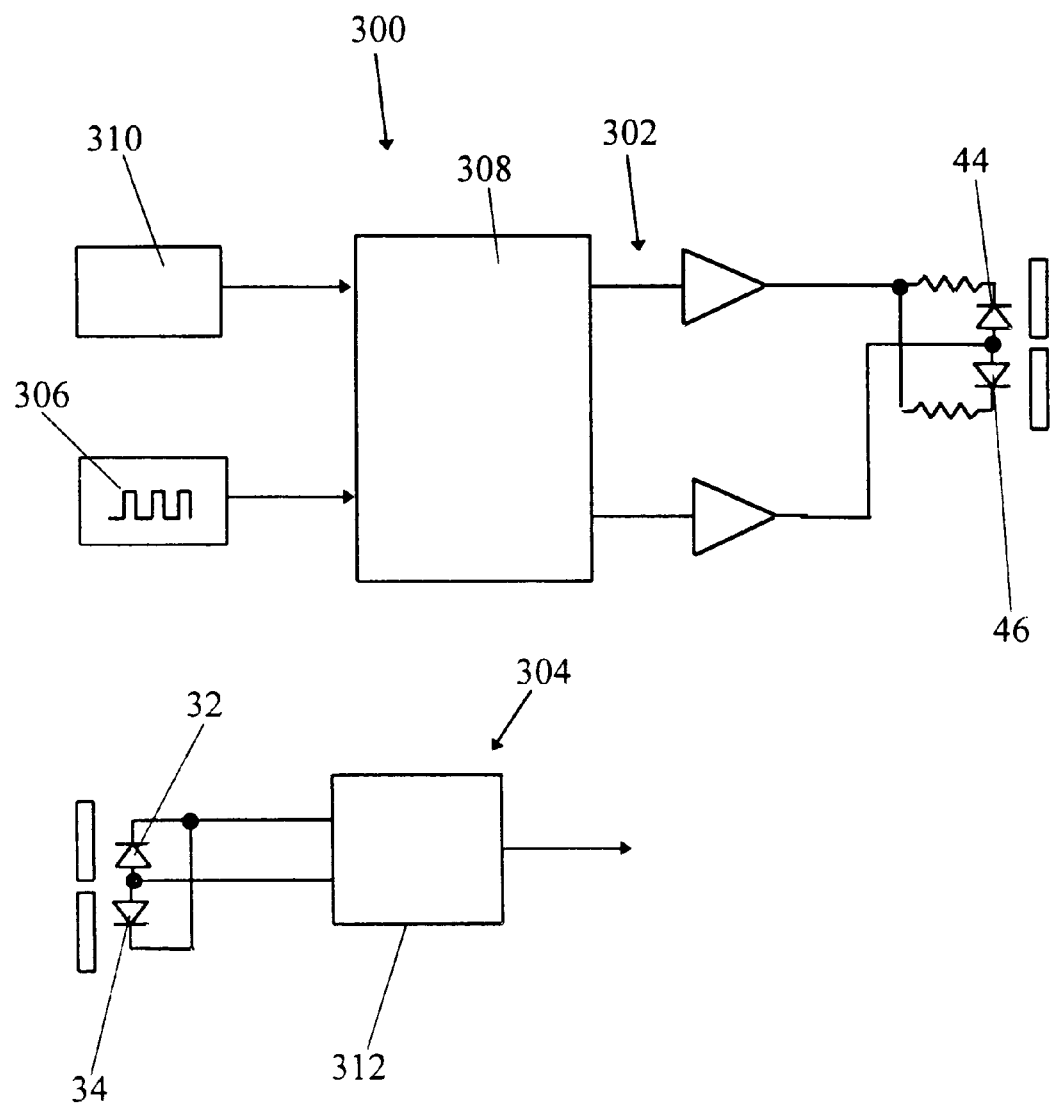
FIG. 15 is a block diagram of a tone transmitter and receiver using the present invention.

A tone transmitter 302 and receiver 304 are shown in FIG. 15. The tone transmitter 302 is an alternative modulated signal generator. The tone transmitter 302 and the receiver 304 may be substituted for the transmitter 72 and the receiver 86 in FIGS. 5 and 6. The tone transmitter 302 has a tone generator 306. A gating circuit 308 takes the digital input data from a digital data source 310 and the tone generator 306. The gating circuit 308 converts the data into a tone signal which is sent to the light emitters 44 and 46. The emitters 44 and 46 may have a horizontal and vertical polarizer as explained above.

The tone signal is received by the tone receiver 304 which is coupled to the opsistor detector 32 and 34. The diode pair 32 and 34 are coupled to a tone decoder ASIC 312 which outputs the digital signal. A tone transceiver may be provided by combining the tone decoder and encoder circuitry on a single ASIC.

In personal computers, a faster and more user friendly IrDA standard is a strong application for the opsistor transmitter and receiver. In fact, any application that finds an advantage using "open air" data transmission is a good fit for opsistor technology. One similar application is data linkage between PC boards over short or long distances.

It will be apparent to those skilled in the art that various modifications and variations can be made in the method and system of the present invention without departing from the spirit or scope of the invention. The present invention is not limited by the foregoing descriptions but is intended to cover all modifications and variations that come within the scope of the spirit of the invention and the claims that follow.

What is claimed is:

1. An optoelectronic coupler, for coupling a source of light signals to a receiver that can process voltage-phase signals, comprising:

a light transmitter capable of generating light signals of first and second bandwidths;

a switch receiver having at least one pair of first and second photodiodes;

a first conductor electrically connecting the anode of the first photodiode to the cathode of the second photodiode;

a second conductor electrically connecting the cathode of the first photodiode to the anode of the second photodiode;

a first light filter disposed on the photoactive surface of the first photodiode that allows the first bandwidth of light to pass;

a second light filter disposed on the photoactive surface of the second photodiode that allows the second bandwidth of light to pass, whereby the light transmitter signals utilizing the first and second bandwidths can be converted into voltage-phase signals across the first and second conductors;

a modulated signal generator for sending data signals to the said optoelectronic coupler's two-wavelength light transmitter for transmission to the photodiodes, the data signals being modulated in a plurality of master profiles and subprofiles with different cycle time variations;

a signal receiver for receiving and decoding the voltage-phase signal from the said optoelectronic coupler's two-wavelength optoelectronic switch receiver.

2. The optoelectronic coupler of claim 1 wherein the light transmitter comprises light emitting diodes.

3. The optoelectronic coupler of claim 1 wherein the light transmitter comprises infra red light emitters.

4. The optoelectronic coupler of claim 1 wherein the light transmitter comprises at least one laser.

5. The optoelectronic coupler of claim 1 wherein the first light filter is a horizontal polarizer and the second light filter is a vertical polarizer.

6. The optoelectronic coupler of claim 1 wherein the modulated signal generator further includes:
   a digital input source generating digital data;
   a signal processing circuit coupled to the digital input source and which encodes the received digital data;
   a memory storing the master waveform profiles coupled to the signal processing circuit;
   a variable clock coupled to the signal processing circuit;
   a waveform generator coupled to the signal processing circuit, the variable clock and the memory, wherein the waveform generator generates an electrical signal using a selected master waveform at a clock rate set by the variable clock, the electrical signal driving the light transmitter.

7. The optoelectronic coupler of claim 1 wherein the modulated signal generator is a microprocessor.

8. The optoelectronic coupler of claim 1 wherein the switch receiver is fabricated on a monolithic silicon substrate and wherein the light transmitter comprises amorphous silicon light emitting diodes fabricated on the same monolithic silicon substrate.

9. The optoelectronic coupler of claim 1 wherein the data signal is modulated using a first master profile with a 25% positive voltage duty cycle, a second master profile with a 50% positive voltage duty cycle, and a third master profile with a 75% positive voltage duty cycle, and wherein the first, second and third master profiles have nine subprofiles which vary the corresponding profile by one quarter period increments.

10. The optoelectronic coupler of claim 9 wherein the data in the data signal is transmitted as 4 bit nibbles and 16 of the subprofiles each encode one of the 16 digital sequences for the 4 bit nibble.

11. The optoelectronic coupler of claim 10 wherein the remaining subprofiles encode single 0, single 1, single space and a multiplier factor.

12. The optoelectronic coupler of claim 11 wherein the multipliers are used to compress identical and continuous sequences of 4 bit nibbles.

13. The optoelectronic coupler of claim 1 wherein the modulated signal generator is a tone transmitter having an input source and a tone generator and wherein a data signal is encoded using carrier tone detection, and wherein the signal receiver decodes a tone signal.

14. The optoelectronic coupler of claim 1 further comprising a fiber optic cable in contact between the transmitter and switch receiver.

15. A method of transmitting and receiving digital data using a light transmitter generating light signals at two bandwidths, the method comprising the steps of:
   modulating data signals with a plurality of master profiles and subprofiles with different cycle time variations;
   generating light signals of first and second bandwidths representative of the data signals;
   receiving the light signals by a switch receiver having at least one pair of first and second photodiodes;
   a first conductor electrically connecting the anode of the first photodiode to the cathode of the second photodiode;
   a second conductor electrically connecting the cathode of the first photodiode to the anode of the second photodiode;
   a first light filter disposed on the photoactive surface of the first photodiode that allows the first bandwidth of light to pass;
   a second light filter disposed on the photoactive surface of the second photodiode that allows the second bandwidth of light to pass;
   converting the light signals into voltage-phase signals across the first and second conductors;
   receiving and decoding the voltage-phase signal from the said optoelectronic coupler's two-wavelength optoelectronic switch receiver.

16. The method of claim 15 wherein the light transmitter comprises light emitting diodes.

17. The method of claim 15 wherein the light transmitter comprises infra red light emitters.

18. The method of claim 15 wherein the light transmitter comprises at least one laser.

19. The method of claim 15 wherein the step of generating light signals includes filtering a light signal using a horizontal polarizer and filtering the light signal using a vertical polarizer.

20. The method of claim 15 further comprising the steps of:
   modulating the data signal using a first master profile with a 25% positive voltage duty cycle, a second master profile with a 50% positive voltage duty cycle, and a third master profile with a 75% positive voltage duty cycle, and wherein the first, second and third master profiles have nine subprofiles which vary the corresponding profile by one quarter period increments.

21. The method of claim 20 further comprising the steps of:
   transmitting the data in the data signal as 4 bit nibbles:
   encoding one of 16 of the subprofiles to represent the logic sequence for the 4 bit nibble.

22. The method of claim 21 further comprising the steps of:
   encoding one of the remaining subprofiles as a single 0;
   encoding one of the remaining subprofiles as a single 1; and
   encoding one of the remaining subprofiles as a multiplier value.

23. The optoelectronic coupler of claim 22 further comprising the steps of:
   identifying identical and continuous sequences of 4 bit nibbles;
   selecting a multiplier value;
   sending the identified identical and continuous nibble as a single nibble and the selected multiplier value.

24. The method of claim 15 further comprising the step of encoding the data signal using carrier tone detection.

* * * * *